US008139859B2

(12) United States Patent
Krüger et al.

(10) Patent No.: US 8,139,859 B2
(45) Date of Patent: Mar. 20, 2012

(54) METHOD FOR AUTOMATIC DETECTION OF DATA IN IN-VIVO IMAGES

(75) Inventors: Gunnar Krüger, Erlangen (DE); Bénédicte Mortamet, Lausanne (CH)

(73) Assignee: Siemens Schweiz AG, Zurich (CH)

( * ) Notice: Subject to any disclaimer, the term of this patent is extended or adjusted under 35 U.S.C. 154(b) by 350 days.

(21) Appl. No.: 12/569,961

(22) Filed: Sep. 30, 2009

(65) Prior Publication Data

US 2010/0080460 A1 Apr. 1, 2010

(30) Foreign Application Priority Data

Sep. 30, 2008 (EP) .................................... 08017182

(51) Int. Cl.
*G06K 9/00* (2006.01)
*G06K 9/34* (2006.01)

(52) U.S. Cl. ......................... 382/171; 382/172; 382/257

(58) Field of Classification Search .................. 382/131, 382/168, 171, 172, 173, 199, 257, 275, 286, 382/308

See application file for complete search history.

(56) References Cited

U.S. PATENT DOCUMENTS 7,274,810 B2 * 9/2007 Reeves et al. ................. 382/128
2008/0118136 A1 * 5/2008 Cai et al. ....................... 382/131

OTHER PUBLICATIONS

Yang, Yong, et al., "A Novel Statistical Method for Segmentation of Brain MRI," Institute of Biomedical Engineering, Xi'an Jiaotong University, Xi'an, 710049, China, 2004, pp. 946-949.

Atkins, M. Stella, et al., "Fully Automatic Segmentation of the Brian in MRI," IEEE Transactions on Medical Imaging, vol. 17, No. 1, Feb. 1998, pp. 98-107.

Wells, III, W. M., et al., "Adaptive Segmentation of MRI Data," IEEE Transactions on Medical Imaging, vol. 15, No. 4, Aug. 1996, pp. 429-442.

Stadler, Alfred, et al., "Artifacts in Body MR Imaging: Their Appearance and How to Eliminate Them," Department of Radiology, Medical University of Vienna, Währinger Gürtel 18-20, 1090 Vienna, Austria, Published online Dec. 6, 2006, pp. 1242-1255.

Clark, II, James A., et al., "Common Artifacts Ecountered in Magnetic Resonance Imaging," Radiologic Clinics of North America, vol. 26, No. 5, Sep. 1988, pp. 893-920.

Hedley, Mark, et al., Motion Artifact Suppression: A Review of Post-Proceeding Techniques, University of Sydney, Department of Electrical Engineering, NSW Australia, 2006, pp. 627-635.

Mirowitz, Scott A, "MR Imaging Artifacts," Mallinckrodt Institute of Radiology, Washington University School of Medicine, St. Louis, Missouri, vol. 7, No. 4, Nov. 1999, pp. 717-732.

* cited by examiner

*Primary Examiner* — Phuoc Tran
(74) *Attorney, Agent, or Firm* — Laurence A. Greenberg; Werner H. Stemer; Ralph E. Locher

(57) ABSTRACT

A method for detecting, in single time-point, in-vivo imaging data related to artifacts in the imaging of objects, includes acquiring at least one in-vivo image with imaging apparatus. A background image corresponds to imaged air of the in-vivo image. The background image is obtained in two steps. A first step includes establishing an object-air boundary and a second step is an atlas-based refinement of a background volume of interest. A histogram reflects an intensity distribution of the background image. The background image is formed of a set of voxels where artifacts are detected. Intensities above a definable intensity value provide an initial estimate of a range of artifacts intensities. A modified morphological opening operation is executed, formed of an erosion of a set of voxels and a dilation, performed iteratively and constrained to voxels intensity above the intensity value, so that the opening operation provides natural definition of artifacts regions.

4 Claims, 1 Drawing Sheet

METHOD FOR AUTOMATIC DETECTION OF DATA IN IN-VIVO IMAGES

CROSS-REFERENCE TO RELATED APPLICATION

This application claims the priority, under 35 U.S.C. §119, of European Patent Application EP 08 017 182.0, filed Sep. 30, 2008; the prior application is herewith incorporated by reference in its entirety.

BACKGROUND OF THE INVENTION

Field of the Invention

The invention relates to a method for automatic detection in single time-point of in-vivo imaging data related to artifacts in the imaging of objects.

The proposed invention intends to achieve artifact detection in single time-point in-vivo imaging data in an automated manner and especially MR based data (Magnetic Resonance based imaging data). Sufficiently good MR imaging quality is a prerequisite to derive diagnostic information with high reliability. Standard quality assurance (abbreviated as QA) protocols are based on specially constructed phantoms and include analysis of image quality-related system parameters such as gradient linearity, geometric accuracy, high-contrast resolution, slice thickness/position accuracy, image intensity uniformity, percent signal ghosting and low-contrast object detectability. Although those QA tests are mandatory and standard procedure during tune-up and service of MR systems on clinical scanners to detect machine-specific artifacts, no automated program to effectively analyze patient-related artifacts is used in practice.

Signal-to-noise ratio (abbreviated as SNR) has traditionally been presented as an important index of image quality in magnitude human MR images. A signal is typically measured as the mean intensity within a region of interest in the imaged object (e.g. brain tissue) whereas it is natural to look for noise on a region (called background) of the image with no signal, that is over air (see references [1], [2]). SNR measures, however, are not necessarily sensitive to patient-induced artifacts that often manifest as signal intensity being mis-mapped to an incorrect spatial location relative to tissues being imaged. Major types of patient-related artifacts are: edge artifacts (chemical shifts, ringing, ghosting from motion), flow artifacts, aliasing (wraparound from improper patient positioning and protocol planning e.g. nose wrap) artifacts (see references [3] to [6]).

SUMMARY OF THE INVENTION

It is accordingly an object of the invention to provide a method for automatic detection of data in in-vivo images, which overcomes the herein-aforementioned disadvantages of the heretofore-known methods of this general type and which detects artifacts in single time-point in-vivo imaging data in an effective automated manner, especially for MR based imaging data.

Over an imaging process, most of the artifact based detection signal intensities arise and propagate into a so called background (like noise in opposition to an effective signal). The invention uses the fact that a careful analysis of this background can therefore provide sufficient information to detect a presence of artifacts and derive a sensitive quality index from patient magnitude images. The present method according to the invention hence provides a technique, which is able to be automated, for defining a background or ROIs of the background (ROI=Region Of Interest) from a single image which is able to be used to automatically derive effective quality measures.

Based on a single image (associated to a complex, magnitude image or a frequency based so called "k-space" data), the proposed invention automates the detection of patient-induced artifacts and allows the classification of data quality prospectively or retrospectively.

With the foregoing and other objects in view there is provided, in accordance with the invention, a method for detecting, in single time-point, in-vivo imaging data related to artifacts in the imaging of objects. The method comprises acquiring at least one in-vivo image with an imaging apparatus, forming a background image corresponding to an imaged air of the in-vivo image, obtaining the background image in a first step including establishing an object-air boundary and a second step formed of an atlas-based refinement of a background volume of interest, forming a histogram reflecting an intensity distribution of the background image, forming the background image of a set of voxels where artifacts are detected, providing an initial estimate of a range of artifact intensities from intensities above a definable intensity value, and executing a modified morphological opening operation, formed of an erosion of a set of voxels and a dilation, performed iteratively and constrained to voxels intensity above the intensity value, causing the opening operation to provide a natural definition of artifacts regions.

The main advantage of the proposed method according to the invention is that it allows an automatic derivation of quality measures from e.g. an MR image (such as images of a human brain). It is a way to test the eligibility of data to further guarantee accurate and reproducible post-processing measures, such as brain tissue classification.

Further advantages of this invention are that:

a) this method, if applied just after a scan session and ideally incorporated in image reconstruction, may eventually inform an MR operator about low-quality directly after the scan and advise of the need to rescan while the patient is still in an MR bore. Consequently, the number of call-back examinations and thus overall patient burden could be reduced;

b) since the proposed invention is automated, it offers perfect repeatability, unlike human graders, where inter-observer and intra-observer repeatability is an issue;

c) this method can be directly extended to data with other contrasts, using parallel-imaging techniques or corrected for various MR-related intensity inhomogeneities or geometrical distortions (e.g. by known B1-intensity variation of a phased array of receiving coils, RF magnetic field imperfections, gradient coil nonlinearities).

According to the invention, the method for automatic detection and hence for quality control of a single human brain MR image is achieved in a two-step process based on:

(1) a background air region delineation, and (2) a detection of artifactual voxels.

Firstly, background air region delineation is performed through the use of a first step (a): segmentation of the whole head (as a human body part), and a second step (b): refinement of the volume of interest (abbreviated as VOI).

The first step (a) is based on the establishment of a scalp/air boundary through the use of computation on a magnitude gradient image. Such a transition is quite sharp and can be enhanced by preliminary anisotropic diffusion filtering. In order to exclude non-scalp/air boundary voxels, a threshold is computed, from the magnitude gradient image histogram, which is defined as the intensity corresponding to a small amount (e.g. 1%) of the number of non-zero voxels in the image (empirically defined frequency threshold). This thresholding produces a set of voxels belonging to the outer scalp boundary refined by a closing operation. Then a hole-filling process creates a single volume containing the entire head. Since the goal relies on detecting artifacts that cause signal fluctuations in brain tissue (i.e. artifacts affecting the neck region are not of interest), a restriction is provided in a background noise analysis to a VOI above the plane passing through a nasion-to-posterior-of-the-cerebellum line and perpendicular to a corresponding sagittal plane. The VOI is codified in a home-built so called T1-weighted magnetic resonance image template (i.e. an image obtained by an imaging technique based on a spin lattice relaxation, which is also called longitudinal relaxation or abbreviated as T1). This template is aligned with a subject scan with a 12-parameter affine transformation during step (b). Finally, regions below this plane are appended to a head mask resulting from step (a) and a background image is finally obtained after exclusive masking.

Secondly, a detection of artifactual voxels is performed over all voxels defined in the previous background mask. For purposes of clarity, let us index N image voxels i belonging to a background with $i \in S=\{1, 2, \ldots, N\}$ and denote the intensity of voxel i by $x_i$ and the background intensity histogram by H. Artifact intensities overlap with true noise ones, so that a primary concern is to define a threshold to remove low-intensity noise in the background. An intensity t1 at a maximal amplitude of H gives an initial estimate of the range of artifact intensities. A thresholding produces a volume with a set of voxels described as $X_{t1}=\{i \in S: x_i > t_1\}$. After thresholding, the volume still contains voxels with an intensity due to true noise and is randomly scattered through the volume. In order to remove the remaining noise, a modified morphological opening operation (see examples in references [7], [8]), formed of an erosion of the set of voxels $X_{t1}$ using a 3D cross structuring element, and a dilation, is performed iteratively with the same kernel and constrained to voxels intensity above the intensity $t_1$. The result of this process is a natural definition of artifact regions where statistics can be performed. For example, the proportion of voxels with an intensity that is corrupted by artifacts and normalized by the background size is advantageously a sensitive quality index.

In a further step, the previous method can be tuned to be more specific to a particular artifact pattern (e.g. eye movement creates artifacts only along the phase-encoding direction). Introducing models with prior-knowledge about the spatial pattern of different artifact sources may allow a more detailed analysis as well as a better classification and further detection of all artifacts.

In summary, the method for detecting, in single time-point, in-vivo imaging data related to artifacts in the imaging of at least one object (for instance applied to imaging of the head with the brain as the tissue and moving eyes as the artifacts) according to the invention includes the following main steps and features:

- at least one in-vivo image is acquired through the use of an imaging apparatus,
- a background image corresponds to the imaged air of the in-vivo image,
- the background image is obtained in two steps, a first step including establishing an object-air boundary, and a second step being an atlas-based refinement of a background volume of interest,
- a histogram (H) reflects an intensity distribution of the background image,
- the background image is formed of a set of voxels where artifacts are detected, intensities above a definable intensity value ($t_1$) provide an initial estimate of a range of artifact intensities,
- a modified morphological opening operation is executed, formed of an erosion of a set of voxels and a dilation, performed iteratively and constrained to voxels intensity above the intensity value ($t_1$), so that the opening operation provides a natural definition of artifacts regions,
- the background image is provided over data processing based on spatial or frequency coordinates,
- the definition of artifact regions is used to perform statistical analysis and derive sensitive quality indices on artifacts characteristics, such as a proportion of voxels with intensities corrupted by artifacts, a mean intensity and/or a standard deviation of these artifactual voxels.

Through the use of this method, it is hence advantageously possible to effectively detect artifacts that can impair the quality of imaging. If such artifacts are detected, it is also possible to filter out the voxels related to the artifact, so that only the parts of an imaged object (free of artifacts) remain with quality optimized imaging.

Other features which are considered as characteristic for the invention are set forth in the appended claims.

Although the invention is illustrated and described herein as embodied in a method for automatic detection of data in in-vivo images, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
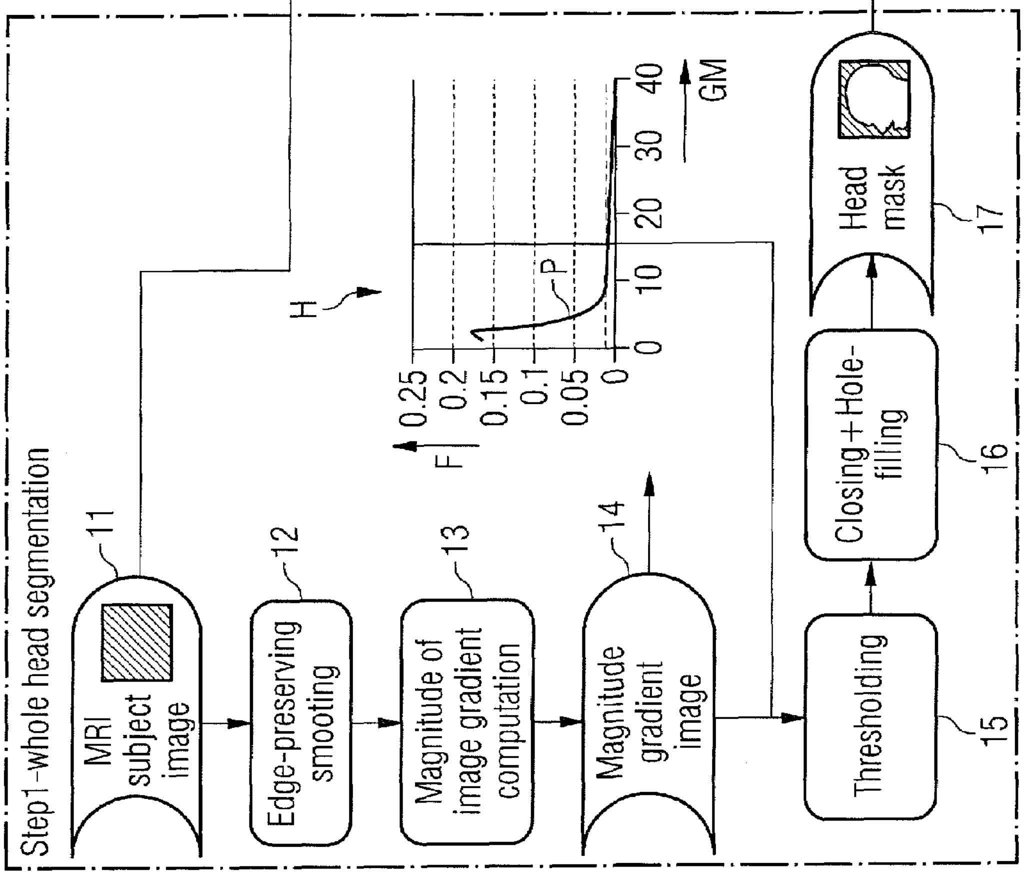
FIG. 1 is a flow chart showing a first step of segmentation of a head MR-image.

Referring now to the figures of the drawings in detail and first, particularly, to FIG. 1 thereof, there is seen a first step of segmentation of a head MR-image according to the present invention. After imaging the head (step 11) through the use of MR-imaging, the imaging data are smoothed under edge-preserving (step 12) and a gradient image is created from which the magnitude is computed (step 13). A final magnitude gradient image (step 14) is hence obtained for which a thresholding (step 15) through the use of previously mentioned definable intensity value is executed in addition to a closing and hole-filing-processing (step 16) in order to obtain a mask of a head image (step 17). That permits the establishment of a histogram H (frequency F—or number of voxels normalized by image size—against a gradient magnitude GM). Under a selected threshold value TV of the gradient magnitude GM, a peak P of frequency related to scalp/air boundary gradient magnitudes can be monitored (detected) as an indicator of the presence of tissue (considered to be the head in this example).

Figure 2:
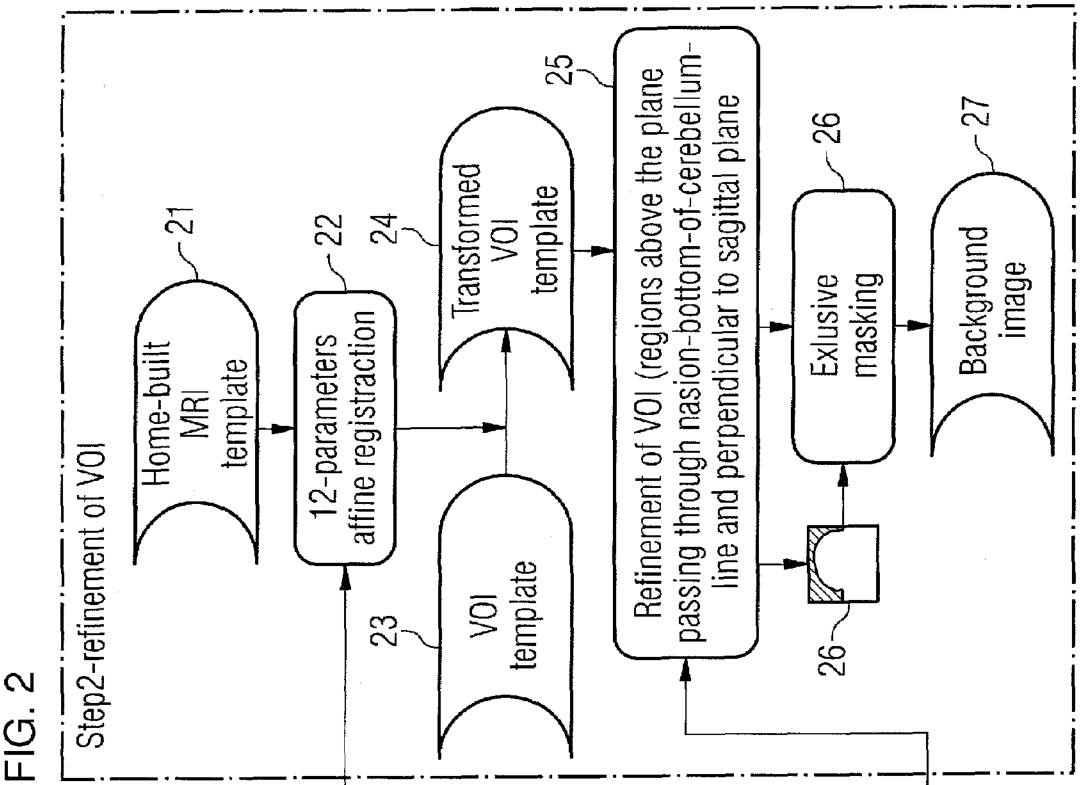
FIG. 2 is a flow chart showing a second step of VOI-refinement of a head MR-image.

FIG. 2 is related to FIG. 1 and presents a complementary, second step of VOI-refinement of the previous head MR-image. From a home-built MR-Imaging template (block 21), an affine transformation or registration including e.g. 12 parameters (block 22) performs the transformation on imaged head (intensity) data from step 11 of FIG. 1. An additional predefined template of VOIs (block 23) is transformed (step 24) according to the transformed head image (intensity) data. Through the use of the data of the head mask from step 17, that is conditioned by the previous thresholding according to FIG. 1, it is hence possible to refine (step 25) the region(s) of interest of the mask in view of restricting the detection of artifacts to specific regions, for example in regions above the plane passing through the nasion-bottom-of-cerebellum-line and perpendicular to the sagittal plane. In this way, a further exclusive mask (block 26) can be provided in order to deliver a well-suited background image (block 27) that is necessary for implementing the method of detection according to the invention.

REFERENCES

[1] Kaufman L, Kramer D M, Crooks L E, Ortendahl D A. Measuring signal-to-noise ratios in MR imaging. Radiology 1989; 173(1):265-267.

[2] Henkelman R M. Measurement of signal intensities in the presence of noise in MR images. Med Phys 1985; 12(2): 232-233.

[3] Mirowitz S A. MR imaging artifacts. Challenges and solutions. Magn Reson Imaging Clin N Am 1999; 7(4): 717-732.

[4] Clark J A, 2nd, Kelly W M. Common artifacts encountered in magnetic resonance imaging. Radiol Clin North Am 1988; 26(5):893-920.

[5] Hedley M, Yan H. Motion artifact suppression: a review of post-processing techniques. Magn Reson Imaging 1992; 10(4):627-635.

[6] Saloner D. Flow and motion. Magn Reson Imaging Clin N Am 1999; 7(4):699-715.

[7] Serra J. Image Analysis and Mathematical Morphology: Academic Press, Inc. Orlando, Fla., USA; 1983.

[8] Haralick R M, Sternberg S S, Zhuang X. Image analysis using mathematical morphology. IEEE Transactions on Pattern Analysis and Machine Intelligence 1987; 9(4):532-550.

The invention claimed is:

1. A method for detecting, in single time-point, in-vivo imaging data related to artifacts in the imaging of objects, the method comprising:

acquiring at least one in-vivo image with an imaging apparatus;

forming a background image corresponding to an imaged air of the in-vivo image;

obtaining the background image in a first step including establishing an object-air boundary and a second step formed of an atlas-based refinement of a background volume of interest;

forming a histogram reflecting an intensity distribution of the background image;

forming the background image of a set of voxels where artifacts are detected;

providing an initial estimate of a range of artifact intensities from intensities above a definable intensity value; and executing a modified morphological opening operation, formed of an erosion of a set of voxels and a dilation, performed iteratively and constrained to voxels intensity above the intensity value, causing the opening operation to provide a natural definition of artifacts regions.

2. The method according to claim 1, which further comprises providing the background image over data processing based on spatial or frequency coordinates.

3. The method according to claim 1, which further comprises using the definition of artifacts regions to perform statistical analysis and derive sensitive quality indices on artifacts characteristics, such as a proportion of voxels with intensities corrupted by artifacts, a mean intensity and/or a standard deviation of the artifactual voxels.

4. The method according to claim 2, which further comprises using the definition of artifacts regions to perform statistical analysis and derive sensitive quality indices on artifacts characteristics, such as a proportion of voxels with intensities corrupted by artifacts, a mean intensity and/or a standard deviation of the artifactual voxels.

* * * * *